United States Patent [19]

Kakimi et al.

[11] Patent Number: 4,888,265

[45] Date of Patent: * Dec. 19, 1989

[54] LIGHT-SENSITIVE MICROCAPSULE CONTAINING POLYMERIZABLE COMPOUND AND SILVER HALIDE, AND LIGHT-SENSITIVE MATERIAL EMPLOYING THE SAME WHEREIN THE SILVER HALIDE IS EMBEDDED IN THE SHELL WALL COMPRISED OF POLYUREA OR POLYURETHANE

[75] Inventors: Fujio Kakimi; Shunichi Ishikawa, both of Ashigara, Japan

[73] Assignee: Fuji Photo Film Co., Ltd., Kanagawa, Japan

[ * ] Notice: The portion of the term of this patent subsequent to May 23, 2006 has been disclaimed.

[21] Appl. No.: 24,114

[22] Filed: Mar. 10, 1987

[30] Foreign Application Priority Data

Mar. 10, 1986 [JP] Japan .................................. 61-53872

[51] Int. Cl.$^4$ .............................................. G03C 1/72
[52] U.S. Cl. .................................... 430/138; 430/281; 503/214; 503/215
[58] Field of Search ................ 430/138, 281; 503/214, 503/215

[56] References Cited

U.S. PATENT DOCUMENTS

| | | | |
|---|---|---|---|
| 3,443,948 | 5/1969 | Bryan | 430/138 |
| 3,694,252 | 5/1971 | Gerber et al. | 430/138 |
| 3,694,253 | 5/1971 | Gerber et al. | 430/138 |
| 3,796,669 | 3/1974 | Kiritani et al. | 264/4 |
| 4,529,681 | 7/1985 | Usami et al. | 430/281 |
| 4,624,910 | 11/1986 | Takeda | 430/203 |
| 4,629,676 | 12/1986 | Hayahawa et al. | 430/203 |
| 4,649,098 | 3/1987 | Takeda | 430/281 |
| 4,735,884 | 4/1988 | Tsukahara et al. | 430/138 |

FOREIGN PATENT DOCUMENTS

0203613A2 12/1986 European Pat. Off. .
64701 11/1982 Japan .................. 430/138

*Primary Examiner*—Paul R. Michl
*Assistant Examiner*—Patrick A. Doody
*Attorney, Agent, or Firm*—Sughrue, Mion, Zinn, Macpeak & Seas

[57] ABSTRACT

A light-sensitive microcapsule containing silver halide and a polymerizable compound which is enclosed with a shell comprising a polyurea resin and/or polyurethane resin. A light-sensitive material comprising a light-sensitive layer provided on a support wherein the light-sensitive layer contains microcapsules containing silver halide and a polymerizable compound enclosed with a shell comprising an polyurea resin and/or a polyurethane resin and a reducing agent.

14 Claims, No Drawings

LIGHT-SENSITIVE MICROCAPSULE CONTAINING POLYMERIZABLE COMPOUND AND SILVER HALIDE, AND LIGHT-SENSITIVE MATERIAL EMPLOYING THE SAME WHEREIN THE SILVER HALIDE IS EMBEDDED IN THE SHELL WALL COMPRISED OF POLYUREA OR POLYURETHANE

BACKGROUND OF THE INVENTION

1. Field of the Invention

The present invention relates to a light-sensitive microcapsule containing silver halide and a polymerizable compound, and further relates to a light-sensitive material comprising a light-sensitive layer containing silver halide, a reducing agent and a polymerizable compound provided on a support.

2. Description of Prior Art

Light-sensitive materials comprising a light-sensitive layer containing silver halide, a reducing agent and a polymerizable compound provided on a support can be used in an image forming method in which a latent image of silver halide is formed, and then the polymerizable compound is polymerized to form the corresponding image.

Examples of said image forming methods are described in Japanese Patent Publication Nos. 45(1970)-11149 (corresponding to U.S. Pat. No. 3,697,275), 47(1972)-20741 (corresponding to U.S. Pat. No. 3,687,667) and 49(1974)-10697, and Japanese Patent Provisional Publication Nos. 57(1982)-138632, 57(1982)-142638, 57(1982)-176033, 57(1982)-211146 (corresponding to U.S. Pat. No. 4,557,997), 58(1983)-107529 (corresponding to U.S. Pat. No. 4,560,637), 58(1983)-121031 (corresponding to U.S. Pat. No. 4,547,450) and 58(1983)-169143. In these image forming methods, when the exposed silver halide is developed using a developing solution, the polymerizable compound is induced to polymerize in the presence of a reducing agent (which is oxidized) to form a polymer image. Thus, these methods need a wet development process employing a developing solution. Therefore, the process takes a relatively long time.

An improved image forming method employing a dry process is described in Japanese Patent Provisional Publication Nos. 61(1986)-69062 and 61(1986)-73145. In this image forming method, a recording material (i.e., light-sensitive material) comprising a light-sensitive layer containing a light-sensitive silver salt (i.e., silver halide), a reducing agent, a cross-linkable compound (i.e., polymerizable compound) and a binder provided on a support is imagewise exposed to form a latent image, and then the material is heated to polymerize within the area where the latent image of the silver halide has been formed. The above method employing the dry process and the light-sensitive material employable for such method are also described in Japanese Patent Provisional Publication Nos. 61(1986)-183640, 61(1986)-188535 and 61(1986)-228441.

The above-mentioned image forming methods are based on the principle in which the polymerizable compound is polymerized in the portion where a latent image of the silver halide has been formed.

Further, Japanese Patent Provisional Publication No. 61(1986)-260241 describes another image forming method in which the polymerizable compound in a portion where a latent image of the silver halide has not been formed is polymerized. In this method, when the material is heated, the reducing agent functions as a polymerization inhibitor in the portion where a latent image of the silver halide has been formed, and the polymerizable compound in the other portion is polymerized.

SUMMARY OF THE INVENTION

An object of the present invention is to provide a light-sensitive material which is improved in sensitivity, preservability and easiness of preparation.

Another object of the invention is to provide a light-sensitive material which is advantageously employable in a dry process for forming an image and improved in preservability and sensitivity.

A further object of the invention is to provide a light-sensitive microcapsule which shows high sensitivity to light and is advantageously employable for inclusion in the light-sensitive material.

There is provided by the present invention a light-sensitive microcapsule containing silver halide and a polymerizable compound which is enclosed with a shell comprising a polyurea resin and/or a polyurethane resin.

There is also provided by the present invention a light-sensitive material comprising a light-sensitive layer provided on a support wherein the light-sensitive layer contains microcapsules containing silver halide and a polymerizable compound enclosed with a shell comprising a polyurea resin and/or a polyurethane resin and a reducing agent.

The shell of a polyurea resin is preferably prepared by a reaction between a polyisocyanate compound contained together with the silver halide and the polymerizable compound in a hydrophobic droplet and a polyamine compound contained in an aqueous medium in which the hydrophobic droplet is dispersed.

The shell of a polyurethane resin is preferably prepared by a reaction between a polyisocyanate compound contained together with the silver halide and the polymerizable compound in a hydrophobic droplet and a polyol compound contained in an aqueous medium in which the hydrophobic droplet is dispersed.

DETAILED DESCRIPTION OF THE INVENTION

The light-sensitive microcapsule of the present invention uses as the shell material a polyurea resin and/or a polyurethane resin which is resistant to mechanical impact due to their elasticity, is prominently stably stored for a long time of period, and can be prepared by a known surface polymerization process.

The mean size of the microcapsule preferably ranges from 0.5 to 50 μm, more preferably 1 to 25 μm, most preferably 3 to 20 μm.

The microcapsule of the invention can be prepared by forming a shell comprising a polyurea resin and/or a polyurethane around a core material containing silver halide particles and a polymerizable compound by a surface polymerization process. The silver halide particles may be located within the core material of the obtained microcapsule and/or located on the interface between the core material and the shell of the obtained microcapsule so that a portion of the particle is embedded in the shell.

Preferred process for the preparation of the light-sensitive microcapsules of the invention is performed by dissolving a polyisocyanate compound in a core material of a hydrophobic liquid comprising light-sensitive silver halide and a polymerizable compound, and if desired, a reducing agent and a dye or a dye precursor; then the hydrophobic liquid is dispersed in an aqueous medium containing a polyamine compound or a polyol compound to form a dispersion containing small droplets of the hydrophobic core material, wherein the dispersion preferably contains a catalyst for accelerating polycondensatin reaction between the polyisocyanate compound and a polyamine compound and/or a polyol compound; and heating the dispersion to 40°–90° C. to form a polyurea resin (reaction product of the polyisocyanate compound and the polyamine compound) and/or a polyurethane resin (reaction product of the polyisocyanate compound and the polyol compound) to give light-sensitive microcapsules.

The polyurea resin shell and polyurethane resin shell prepared according to the above process are preferred, because thus prepared shell has such a dense polymer wall as to efficiently prevent passage of gasses through the shell wall.

A number of processes for the preparation of microcapsules having a shell of a polyurea resin and a polyurethane resin other than the above-described preferable process are known. These processes are also employable for the preparation of the light-sensitive microcapsule of the invention.

In the present invention, the terms "polyurea resin" and "polyurethane resin" are not construed to indicate polymers containing, respectively, the urea bondings only or the urethane bondings only. For instance, the polyurethane resin include a polyurethane resin in which certain portions of the urethane bondings are replaced with urea bondings. This is also applied to the polyurea resin.

Examples of the polyisocyanate compounds, polyamine compounds, and polyol compounds include the following compound.

The polyisocyanate can be a diisocyanate compound such as m-phenylene diisocyanate, p-phenylene diisocyanate, 2,6-tolylene diisocyanate, 2,4-tolylene diisocyanate, naphthalene-1,4-diisocyanate, diphenylmethane-4,4'-disocyanate, 3,3'-dimethoxy-4,4'-biphenyl diisocyanate, 3,3'dimethyl-4,4'-diisocyanate, xylylene-1,4-diisocyanate, xylylene-1,3-diisocyanate, 4,4'-diphenylpropane diisocyanate, trimethylene diisocyanate, hexamethylene diisocyanate, propylene-1,2-diisocyanate, butyrene-1,2-diisocyanate, ethylidyne diisocyanate, cyclohexylene-1,2-diisocyanate or cyclohexylene-1,4-diisocyanate; a triisocyanate compound such as 4,4',4''-triphenylmethane triisocyanate, toluene-2,4,6-triisocyanate or polymethylene polyphenyl triisocyanate; a tetraisocyanate compound such as 4,4'-dimethyldiphenylmethane-2,2',5,5'-tetraisocyanate; or a polyisocyanate prepolymer such as an addition compound of hexamethylene diisocyanate and hexanetriol, an addition compound of 2,4-tolylene diisocyanate and catechol or an addition compound of tolylene diisocyanate and trimethylolpropane.

The polyamine compound can be ethylenediamine, trimethylenediamine, tetramethylenediamine, pentamethylenediamine, hexamethylenediamine, p-phenylenediamine, m-phenylenediamine, piperazine, 2-methylpiperazine, 2,5-dimethylpiperazine, 2-hydroxytrimethylenediamine, diethylaminopropylamine, tetraethylenepentamine, or an amine adduct of an epoxy compound.

The polyol compound can be ethylene glycol, 1,4-butanediol, chatecol, resorcinol, hydroquinone, 1,2-dihydroxy-4-methylbenzene, 1,3-dihydroxy-5-methylbenzene, 3,4-dihydroxy-1-methylbenzene, 3,5-dihydroxy-1-methylbenzene, 2,4-dihydroxyethylbenzene, 1,3-naphthalenediol, 1,5-naphthalenediol, 2,7-naphthalenediol, or 2,3-naphthalenediol.

For the incorporation of silver halide and a polymerizable compound into the hydrophobic liquid for the preparation of the core material, silver halide is generally incorporated first into an aqueous medium for the preparation of a silver halide emulsion and then the emulsion is mixed with a hydrophobic solvent. The aqueous medium of the silver halide emulsion is moved at a later stage into an aqueous medium employed for the preparation of the microcapsules. Thus, there is brought little water into the core of the obtained microcapsule. Simultaneously with the movement of water, silver halide particles move from the inside of the core material phase (oily phase) to the dispersion medium phase (aqueous phase), whereby not a small amount of silver halide particles gather in the vicinity of the interface between the core material phase and the dispersing medium phase. Accordingly, the silver halide particles are apt to be present in the vicinity or even within the shell at high concentration, if the silver halide is incorporated into the core material using a silver halide emulsion. Such localized distribution of silver halide particles does not adversely affect the property of the light-sensitive capsule, and it is probable that such distribution is preferable in enhancement of the sensitivity.

Polymers having a principal chain consisting essentially of a hydrocarbon chain substituted in part with hydrophilic groups which contain, in their terminal groups, —OH or nitrogen having a lone electron-pair are preferably introduced into the polymerizable compound prior to the preparation of the light-sensitive composition. The polymer has a function of dispersing silver halide or other component in the polymerizable compound very uniformly as well as a function of keeping thus dispered state. Further, the polymer has another function of gathering silver halide along the interface between the polymerizable compound (i.e., light-sensitive composition) and the aqueous medium in preparation of the microcapsule. Therefore, using this polymer, silver halide can be easily introduced into the shell of the microcapsule.

The silver halide particles can be incorporated into the core material by other methods than the method using a silver halide emulsion. For instance, a dispersion containing silver halide particles dispersed in an organic solvent can be utilized for the incorporation. Alternatively, powdery silver halide can be simply mixed with a polymerizable compound.

The light-sensitive microcapsules prepared in the above-described manners can be separated from the aqueous medium by known separation methods such as evaporation, filtration and centrifugal separation.

There is no specific limitation with respect to silver halide contained in the light-sensitive capsule.

Examples of the silver halides include as silver chloride, silver bromide, silver iodide, silver chlorobromide, silver chloroiodide, silver iodobromide, and silver chloroiodobromide in the form of grains.

The halogen composition of individual grains may be homogeneous or heterogeneous. The heterogeneous grains having a multilayered structure in which the halogen composition varies from the core to the outer shell (see Japanese Patent Provisional Publication Nos. 57(1982)-154232, 58(1983)-108533, 59(1984)-48755 and 59(1984)-52237, U.S. Pat. No. 4,433,048, and European Patent Application No. 100,984) can be employed.

There is no specific limitation on the crystal habit of silver halide grains. Two or more kinds of silver halide grains which differ in halogen composition, crystal habit, grain size, and/or other features from each other can be used in combination. There is no specific limitation on grain size distribution of silver halide grains. The silver halide grains ordinarily have a mean size of 0.001 to 5 μm, more preferably 0.001 to 2 μm.

The silver halide is preferably prepared in the form of a silver halide emulsion. Various processes for the preparation of the silver halide emulsion are known in the conventional technology for the preparation of photographic materials.

The silver halide emulsion can be prepared by the acid process, neutral process or ammonia process. In the stage for the preparation, a soluble silver salt and a halogen salt can be reacted in accordance with the single jet process, double jet process or a combination thereof. A reverse mixing method, in which grains are formed in the presence of excess silver ions, or a controlled double jet process, in which a pAg value is maintained constant, can be also employed. In order to accelerate grain growth, the concentrations or amounts or the silver salt and halogen salt to be added or the rate of their addition can be increased as described in Japanese Patent Provisional Publication Nos. 55(1980)-142329 and 55(1980)-158124, and U.S. Pat. No. 3,650,757, etc.

The silver halide emulsion may be of a surface latent image type that forms a latent image predominantly on the surface of silver halide grains, or of an inner latent image type that forms a latent image predominantly in the interior of the grains. A direct reversal emulsion comprising an inner latent image type emulsion and a nucleating agent may be employed. The inner latent image type emulsion suitable for this purpose is described in U.S. Pat. Nos. 2,592,250 and 3,761,276, Japanese Patent Publication No. 58(1983)-3534 and Japanese Patent Provisional Publication No. 57(1982)-136641, etc. The nucleating agent that is preferably used in combination with the inner latent image type emulsion is described in U.S. Pat. Nos. 3,227,552, 4,245,037, 4,255,511, 4,266,013 and 4,276,364, and West German Patent Provisional Publication (OLS) No. 2,635,316.

In the preparation of the silver halide emulsions, hydrophilic colloids are advantageously used as protective colloids. Examples of usable hydrophilic colloids include proteins, e.g., gelatin, gelatin derivatives, gelatin grafted with other polymers, albumin, and casein; cellulose derivatives, e.g., hydroxyethyl cellulose, carboxymethyl cellulose, cellulose sulfate, etc.; saccharide derivatives, e.g., sodium alginate and starch derivatives; and a wide variety of synthetic hydrophilic polymers, such as polyvinyl alcohol, polyvinyl alcohol partial acetal, poly-N-vinylpyrrolidone, polyacrylic acid, polymethacrylic acid, polyacrylamide, polyvinylimidazole, and polyvinylpyrazole, and copolymers comprising monomers constituting these homopolymers. Among them, gelatin is most preferred. Examples of employable gelatins include not only lime-processed gelatin, but also acid-processed gelatin and enzyme-processed gelatin. Hydrolysis products or enzymatic decomposition products of gelatin can also be used.

In the formation of silver halide grains in the silver halide emulsion, ammonia, an organic thioether derivative as described in Japanese Patent Publication No. 47(1972)-11386 or sulfur-containing compound as described in Japanese Patent Provisional Publication No. 53(1978)-144319 can be used as a silver halide solvent. Further, in the grain formation or physical ripening, a cadmium salt, a zinc salt, a lead salt, a thallium salt, or the like can be introduced into the reaction system. Furthermore, for the purpose of improving high or low intensity reciprocity law failure, a water-soluble iridium salt, e.g., iridium (III) or (IV) chloride, or ammonium hexachloroiridate, or a water-soluble rhodium salt, e.g., rhodium chloride can be used.

After the grain formation or physical ripening, soluble salts may be removed from the resulting emulsion by a known noodle washing method or a sedimentation method. The silver halide emulsion may be used in the primitive condition, but is usually subjected to chemical sensitization. Chemical sensitization can be carried out by the sulfur sensitization, reduction sensitization or noble metal sensitization, or a combination thereof that are known for emulsions for the preparation of the conventional light-sensitive materials.

When the sensitizing dyes are added to the silver halide emulsion, the sensitizing dye is preferably added during the preparation of the emulsion. When the organic silver salts are introduced in the light-sensitive microcapsule, the emulsion of the organic silver salts can be prepared in the same manner as in the preparation of the silver halide emulsion.

There is no specific limitation with respect to the polymerizable compound, and any known polymerizable compounds including monomers, oligomers and polymers can be contained in the light-sensitive microcapsule. In the case that heat development (i.e., thermal development) is utilized for developing the light-sensitive microcapsule, the polymerizable compounds having a relatively high boiling point (e.g., 80° C. or higher) that are hardly evaporated upon heating are preferably employed. In the case that the light-sensitive layer contains a color image forming substance, the polymerizable compounds are preferably cross-linkable compounds having plural polymerizable groups in the molecule, because such cross-linkable compounds favorably serve for fixing the color image forming substance in the course of polymerization hardening of the polymerizable compounds.

The polymerizable compound employable for the light-sensitive microcapsule of the invention are described in the above-mentioned and later-mentioned publications and applications concerning the light-sensitive microcapsule.

Preferred polymerizable compounds employable for the light-sensitive microcapsule are compounds which are polymerizable through addition reaction or ring-opening reaction. Preferred examples of the compounds being polymerizable through addition reaction include compounds having an ethylenic unsaturated group. Preferred examples of the compounds being polymerizable through ring-opening reaction include the compounds having an epoxy group. The compounds having an ethylenic unsaturated group are preferred.

Examples of compounds having an ethylenic unsaturated group include acrylic acid, salts of acrylic acid, acrylic esters, acrylamides, methacrylic acid, salts of methacrylic acid, methacrylic esters, methacrylamide, maleic anhydride, maleic esters, itaconic esters, styrene, styrene derivatives, vinyl ethers, vinyl esters, N-vinyl heterocyclic compounds, allyl ethers, allyl esters, and compounds carrying a group or groups corresponding to one or more of these compounds.

Concrete examples of the acrylic esters include n-butyl acrylate, cyclohexyl acrylate, 2-ethylhexyl acrylate, benzyl acrylate, furfuryl acrylate, ethoxyethoxy acrylate, dicyclohexyloxyethyl acrylate, nonylphenyloxyethyl acrylate, hexanediol diacrylate, butanediol diacrylate, neopentylglycol diacrylate, trimethylolpropane triacrylate, pentaerythritol tetraacrylate, dipentaerythritol pentaacrylate, diacrylate of polyoxyethylenated bisphenol A, polyacrylate of hydroxypolyether, polyester acrylate, and polyurethane acrylate.

Concrete examples of the methacrylic esters include methyl methacrylate, butyl methacrylate, ethylene glycol dimethacrylate, butanediol dimethacrylate, neopentylglycol dimethacrylate, trimethylolpropane trimethacrylate, pentaerythritol trimethacrylate, pentaerythritol tetramethacrylate, and dimethacrylate of polyoxyalkylenated bisphenol A.

The polymerizable compounds can be used singly or in combination of two or more compounds. Further, compounds formed by bonding a polymerizable group such as a vinyl group or a vinylidene group to a reducing agent or a color image forming substance are also employed as the polymerizable compounds. The light-sensitive microcapsules employing these compounds which show functions as both the reducing agent and the polymerizable compound, or of the color image forming substance and the polymerizable compound are included in embodiments of the invention.

The amount of the polymerizable compound for incorporation into the light-sensitive microcapsule preferably ranges from 5 to $1.2 \times 10^5$ times (by weight) as much as the amount of silver halide, more preferably from 10 to $1 \times 10^4$ times as much as the silver halide.

The reducing agent incorporatable into the light-sensitive microcapsule has a function of reducing the silver halide and/or a function of accelerating or restraining a polymerization of the polymerizable compound. Examples of the reducing agents having these functions include various compounds, such as hydroquinones, catechols, p-aminophenols, p-phenylenediamines, 3-pyrazolidones, 3-aminopyrazoles, 4-amino-5-pyrazolones, 5-aminouracils, 4,5-dihydroxy-6-aminopyrimidines, reductones, aminoreductones, o- or p-sulfonamidophenols, o- or p-sulfonamidonaphthols, 2-sulfonamidoindanones, 4-sulfonamido-5-pyrazolones, 3-sulfonamidoindoles, sulfonamidopyrazolobenzimidazoles, sulfonamidopyrazolotriazoles, α-sulfonamidoketones, hydrazines, etc. Depending on the nature or amount of the reducing agent, the polymerizable compound in either a portion where a latent image of the silver halide has been formed or a portion where a latent image of the silver halide has not been formed can be polymerized. In the developing system in which the polymerizable compound in the portion where the latent image has not been formed is polymerized, 1-phenyl-3-pyrazolidone is preferably employed as the reducing agent.

Other employable reducing agents are described in T. James, "The Theory of the Photographic Process", 4th edition, 291–334 (1977), Research Disclosure No. 17029, 9–15 (June 1978), and Research Disclosure No. 17643, 22–31 (December 1978). The reducing agents described in the above text can be used in the light-sensitive material of the present invention. Thus, "the reducing agent(s)" in the present specification means to include all of known reducing agents.

These reducing agents can be used singly or in combination. In the case that two or more reducing agents are used in combination, certain interactions between these reducing agents may be expected. One of the interactions is for acceleration of reduction of silver halide (and/or an organic silver salt) through so-called super-additivity. Other interaction is for a chain reaction in which an oxidized state of one reducing agent formed by a reduction of silver halide (and/or an organic silver salt) induces or inhibits the polymerization of the polymerizable compound via oxidation-reduction reaction with other reducing agent. Both interactions may occur simultaneously. Thus, it is difficult to determine which of the interactions has occurred in practical use.

Examples of these reducing agents include pentadecylhydroquinone, 5-t-butylcatechol, p-(N,N-diethylamino)phenol, 1-phenyl-4-methyl-4-hydroxymethyl-3-pyrazolidone, 1-phenyl-4-methyl-4-heptadecylcarbonyloxymethyl-3-pyrazolidone, 2-phenylsulfonylamino-4-hexadecyloxy-5-t-octylphenol, 2-phenylsulfonylamino-4-t-butyl-5-hexadecyloxyphenol, 2-(N-butylcarbamoyl)-4-phenylsulfonylaminonaphtol, 2-(N-methyl-N-octadecylcarbamoyl)-4-sulfonylaminonaphthol, 1-acetyl-2-phenylhydrazine, 1-acetyl-2-(p- or o-aminophenyl)hydrazine, 1-formyl-2-(p- or o-aminophenyl)hydrazine, 1-acetyl-2-(p- or o-methoxyphenyl)hydrazine, 1-lauroyl-2-(p- or o-aminophenyl)hydrazine, 1-trityl-2-(2,6-dichloro-4-cyanophenyl)hydrazine, 1-trityl-2-phenylhydrazine, 1-phenyl-2-(2,4,6-trichlorophenyl)hydrazine, 1-{2-(2,5-di-tert-pentylphenoxy)-butyloyl}-2-(p- or o-aminophenyl)hydrazine, 1-{2-(2,5-di-t-pentylphenoxy)butyloyl}-2-(p- or o-aminophenyl)-hydrazine pentadecylfluorocaprylate salt, 3-indazolinone, 1-(3,5-dichlorobenzoyl)-2-phenylhydrazine, 1-trityl-2-[{(2-N-butyl-N-octylsulfamoyl)-4-methanesulfonyl}phenyl]hydrazine, 1-{4-(2,5-di-tert-pentylphenoxy)butyloyl}-2-(p- or o-methoxyphenyl)hydrazine, 1-(methoxycarbonylbenzohydryl)-2-phenylhydrazine, 1-formyl-2-[4-{2-(2,4-di-tert-pentylphenoxy)-butylamide}phenyl]hydrazine, 1-acetyl-2-[4-{2-(2,4-di-tert-pentylphenoxy)butylamido}phenyl]hydrazine, 1-trityl-2-[{2,6-dichloro-4-(N,N-di-2-ethylhexyl)carbamoyl}phenyl]hydrazine, 1-(methoxycarbonylbenzohydryl)-2-(2,4-dichlorophenyl)hydrazine and 1-trityl-2-[{2-(N-ethyl-N-octylsulfamoyl)-4-methanesulfonyl}phenyl]hydrazine.

The amount of the reducing agent in the light-sensitive microcapsule preferably ranges from 0.1 to 1,500 mole % based on the amount of silver (contained in the above-mentioned silver halide and an organic silver salt).

The light-sensitive microcapsule can further contain optional components such as color image forming substances, sensitizing dyes, organic silver salts, various kinds of image formation accelerators (e.g., base or base precursor, oil, surfactant, heat-melt solvent), thermal polymerization inhibitors, thermal polymerization initiators, development stopping agents, fluorescent brightening agents, discoloration inhibitors, antihalation dyes or pigments, antiirradiation dyes or pigments, matting agents, antismudging agents, plasticizers, water releasers and binders.

There is no specific limitation with respect to the color image forming substance, and various kinds of substances can be employed. Thus, examples of the color image forming substance include both colored substance (i.e., dyes and pigments) and non-colored or almost non-colored substance (i.e., color former or dye- or pigment-precursor) which develops to give a color under application of external energy (e.g., heating, pressing, light irradiation, etc.) or by contact with other components (i.e., developer).

Examples of the dyes and pigments (i.e., colored substances) employable in the invention include commercially available ones, as well as various known compounds described in the technical publications, e.g., Yuki Gosei Kagaku Kyokai (ed.), Handbook of Dyes (in Japanese, 1970) and Nippon Ganryo Gijutsu Kyokai (ed.), New Handbook of Pigments (in Japanese, 1977). These dyes and pigments can be used in the form of a solution or a dispersion.

Examples of the substances which develop to give a color by certain energy includes thermochromic compounds, piezochromic compounds, photochromic compounds and leuco compounds derived from triarylmethane dyes, quinone dyes, indigoid dyes, azine dyes, etc. These compounds are capable of developing a color by heating, application of pressure, light-irradiation or air-oxidation.

Examples of the substances which develop to give a color in contact with other components include various compounds capable of developing a color through some reaction between two or more components, such as acid-base reaction, oxidation-reduction reaction, coupling reaction, chelating reaction, and the like. Examples of such color formation systems are described in Hiroyuki Moriga, "Introduction of Chemistry of Speciality Paper" (in Japanese, 1975), 29–58 (pressure-sensitive copying paper), 87–95 (azo-graphy), 118–120 (heat-sensitive color formation by a chemical change) or in MSS. of the seminer promoted by the Society of Kinki Chemical Industry, "The Newest Chemistry of Coloring Matter—Attractive Application and New Development as a Functional Coloring Matter", 26–32 (June, 19, 1980). Examples of the color formation systems specifically include a color formation system used in pressure-sensitive papers, etc., comprising a color former having a partial structure of lactone, lactam, spiropyran, etc., and an acidic substance (developer), e.g., acid clay, phenol, etc.; a system utilizing azo-coupling reaction between an aromatic a diazonium salt, diazotate or diazosulfonate and naphthol, aniline, active methylene, etc.; a system utilizing a chelating reaction, such as a reaction between hexamethylenetetramine and a ferric ion and gallic acid, or a reaction between a phenolphthalein-complexon and an alkaline earth metal ion; a system utilizing oxidation-reduction reaction, such as a reaction between ferric stearate and pyrogallol, or a reaction between silver behenate and 4-methoxy-1-naphthol, etc.

The color image forming substance in the light-sensitive microcapsule is preferably used in an amount of from 0.5 to 50 parts by weight, and more preferably from 2 to 30 parts by weight, per 100 parts by weight of the polymerizable compound. In the case that the developer is used, it is preferably used in an amount of from about 0.3 to about 80 parts by weight per one part by weight of the color former.

There is no specific limitation with respect to the sensitizing dyes, and known sensitizing dyes used in the conventional art of photography may be employed in the light-sensitive material of the invention. Examples of the sensitizing dyes include methine dyes, cyanine dyes, merocyanine dyes, complex cyanine dyes, complex merocyanine dyes, holopolar cyanine dyes, hemicyanine dyes, styryl dyes, and hemioxonol dyes. These sensitizing dyes can be used singly or in combination. Combinations of sensitizing dyes are often used for the purpose of supersensitization. In addition to the sensitizing dyes, a substance which does not per se exhibit spectral sensitization effect or does not substantially absorb visible light but shows supersensitizing activity can be used. The amount of the sensitizing dye to be added generally ranges from about $10^{-8}$ to about $10^{-2}$ mol per 1 mol of silver halide.

The sensitizing dye is preferably added during the stage of the preparation of the silver halide emulsion.

When the heat development is employed in the use of the light-sensitive material, an organic silver salt is preferably contained in the light-sensitive material. It can be assumed that the organic silver salt takes part in a redox reaction using a silver halide latent image as a catalyst when heated to a temperature of 80° C. or higher. In such case, the silver halide and the organic silver salt preferably are located in contact with each other or close together. Examples of organic compounds employable for forming such organic silver salt include aliphatic or aromatic carboxylic acids, thiocarbonyl group-containing compounds having a mercapto group or an α-hydrogen atom, imino group-containing compounds, and the like. Among them, benzotriazoles are most preferable. The organic silver salt is preferably used in an amount of from 0.01 to 10 mol., and preferably from 0.01 to 1 mol., per 1 mol. of the light-sensitive silver halide. Instead of the organic silver salt, an organic compound (e.g., benzotriazole) which can form an organic silver salt in combination with an inorganic silver salt can be added to the light-sensitive layer to obtain the same effect.

Various image formation accelerators are employable in the light-sensitive material of the invention. The image formation accelerators have a function to accelerate the oxidation-reduction reaction between a silver halide (and/or an organic silver salt) and a reducing agent, a function to accelerate emigration of an image forming substance from a light-sensitive layer to an image-receiving material or an image-receiving layer, or a similar function. The image formation accelerators can be classified into inorganic bases, organic bases, base precursors, oils, surface active agents, hot-melt solvents, and the like. These groups, however, generally have certain combined functions, i.e., two or more of the above-mentioned effects. Thus, the above classification is for the sake of convenience, and one compound often has a plurality of functions combined.

Various examples of these image formation accelerators are shown below.

The base may be an organic base or an inorganic base. Preferred examples of the inorganic bases include hydroxides of alkali metals or alkaline earth metals; secondary or tertiary phosphates, borates, carbonates, quinolinates and metaborates of alkali metals or alkaline earth metals; a combination of zinc hydroxide or zinc oxide and a chelating agent (e.g., sodium picolinate); ammonium hydroxide; hydroxides of quaternary alkylammoniums; and hydroxides of other metals. Preferred examples of the organic bases include aliphatic amines (e.g., trialkylamines, hydroxylamines and aliphatic polyamines); aromatic amines (e.g., N-alkyl-substituted aromatic amines, N-hydroxylalkyl-substituted aromatic amines and bis[p-(dialkylamino)phenyl]-methanes), heterocyclic amines, amidines, cyclic amidines, guanidines, and cyclic guanidines. Of these bases, those having a pKa of 7 or more are preferred.

The base precursors preferably are those capable of releasing bases upon reaction by heating, such as salts of bases and organic acids capable of decarboxylation by heating, compounds capable of releasing amines through intramolecular nucleophilic substitution, Lossen rearrangement, or Beckmann rearrangement, and the like; and those capable of releasing bases by electrolysis. Preferred examples of the base precursors include guanidine trichloroacetate, piperidine trichloroacetate, morpholine trichloroacetate, p-toluidine trichloroacetate, 2-picoline trichloroacetate, guanidine phenylsulfonylacetate, guanidine 4-chlorophenylsulfonylacetate, guanidine 4-methyl-sulfonylphenylsulfonylacetate, and guanidine 4-acetylaminomethyl propionate.

These bases or base precursors are preferably used in an amount of not more than 100% by weight, and more preferably from 0.1 to 40% by weight, based on the total solid content of the light-sensitive layer. These bases or base precursors can be used singly or in combination.

It is preferred that the microcapsule containing the base or base precursor further contains a hot-melt solvent.

The term "hot-melt solvent" in this specification means a solvent which is solid at room temperature and melts by heating under a certain heating condition to function as a solvent of the base. Examples of the hot-melt solvents preferably employable in the invention include compounds belonging to urea, urethane, amide, pyridine, sulfonamide, sulfone, sulfoxide, ester, ketone and ether, having a melting point of not lower than 40° C.

The hot-melt solvents preferably are compounds which may be used as solvent of the reducing agent or those which have high dielectric constant and can accelerate physical development of silver salts. Examples of the hot-melt solvents include polyethylene glycols, derivatives of polyethylene oxides (e.g., oleate ester), beeswax, monostearin and high dielectric constant compounds having —$SO_2$— and/or —CO— group described in U.S. Pat. No. 3,347,675; polar compounds described in U.S. Pat. No. 3,667,959; and 1,10-decanediol, methyl anisate and biphenyl, suberic acid described in Research Disclosure 26-28 (November 1976). The hot-melt solvent is preferably used in an amount of from 0.5 to 50% by weight, and more preferably from 1 to 20% by weight, based on the total solid content of the light-sensitive layer.

Examples of the oils employable in the invention include high-boiling organic solvents which are used as solvents in emulsifying and dispersing hydrophobic compounds.

Examples of the surface active agents employable in the invention include pyridinium salts, ammonium salts and phosphonium salts as described in Japanese Patent Provisional Publication No. 59(1984)-74547; polyalkylene oxides as described in Japanese Patent Provisional Publication No. 59(1984)-57231.

The thermal polymerization initiators employable in the light-sensitive material preferably are compounds that are decomposed under heating to generate a polymerization initiating species, particularly a radical, and those commonly employed as initiators of radical polymerization. The thermal polymerization initiators are described in "Addition Polymerization and Ring Opening Polymerization", 6-18, edited by the Editorial Committee of High Polymer Experimental Study of the High Polymer Institute, published by Kyoritsu Shuppan (1983). Examples of the thermal polymerization initiators include azo compounds, e.g., azobisisobutyronitrile, 1,1'-azobis(1-cyclohexanecarbonitrile), dimethyl 2,2'-azobisisobutyrate, 2,2'-azobis(2-methylbutyronitrile), and azobisdimethylvaleronitrile; organic peroxides, e.g., benzoyl peroxide, di-tert-butyl peroxide, dicumyl peroxide, tert-butyl hydroperoxide, and cumene hydroperoxide; inorganic peroxides, e.g., hydrogen peroxide, potassium persulfate, and ammonium persulfate; and sodium p-toluenesulfinate. By employing the thermal polymerization initiators and adjusting the amount of the reducing agent, the polymerizable compound in either a portion where a latent image of the silver halide has been formed or a portion where a latent image of the silver halide has not been formed can be polymerized. The thermal polymerization initiators are preferably used in an amount of from 0.1 to 120% by weight, and more preferably from 1 to 10% by weight, based on amount of the polymerizable compound. In a system in which the polymerizable compound located in a portion where the latent image has not been formed is polymerized, the thermal polymerization initiators are preferably incorporated into the light-sensitive layer. The light-sensitive material employing the thermal polymerization initiators is described in Japanese Patent Provisional Publication No. 61(1986)-260241.

The development stopping agents employable in the light-sensitive microcapsule are compounds that neutralize a base or react with a base to reduce the base concentration in the microcapsule to thereby stop development, or compounds that mutually react with silver or a silver salt to suppress development. More specifically, examples of the development stopping agents include acid precursors capable of releasing acids upon heating, electrophilic compounds capable of undergoing substitution reaction with a coexisting base upon heating, nitrogen-containing heterocyclic compounds, mercapto compounds, and the like. Examples of the acid precursors include oxide esters described in Japanese Patent Provisional Publication Nos. 60(1985)-108837 and 60(1985)-192939 and compounds which release acids through Lossen rearrangement described in Japanese Patent Provisional Publication No. 60(1985)-230133. Examples of the electrophilic compounds which induce substitution reaction with bases upon heating are described in Japanese Patent Provisional Publication No. 60(1985)-230134.

The antismudging agents employable in the light-sensitive material preferably are particles which are solid at ambient temperatures. Examples of the antismudging agents include starch particles described in U.K. Pat. No. 1,232,347; polymer particles described in U.S. Pat. No. 3,625,736; microcapsule particles containing no color former described in U.K. Pat. No. 1,235,991; and cellulose particles, and inorganic particles, such as particles of talc, kaolin, bentonite, agalmatolite, zinc oxide, titanium dioxide or alumina described in U.S. Pat. No. 2,711,375. Such particles preferably have a mean size of 3 to 50 μm, more preferably 5 to 40 μm. When the microcapsule is employed in the light-sensitive material, the size of said particle is preferably larger than that of the microcapsule.

The light-sensitive microcapsule of the present invention can be advantageously employed for the formation of a light-sensitive layer of a light-sensitive material.

Otherwise, the light-sensitive microcapsule of the invention can be employed as a light-sensitive adhesive.

The light-sensitive material using the above-mentioned light-sensitive microcapsule is further described below.

The light-sensitive material of the invention can be prepared by arranging a light-sensitive layer containing the above-mentioned components on a support. There is no limitation with respect to the support. In the case that heat development is utilized in the use of the light-sensitive material, the material of the support preferably is resistant to heat given in the processing stage. Examples of the material employable for the preparation of the support include glass, paper, fine paper, coat paper, synthetic paper, metals and analogues thereof, polyester, acetyl cellulose, cellulose ester, polyvinyl acetal, polystyrene, polycarbonate, polyethylene terephthalate, and paper laminated with resin or polymer (e.g., polyethylene).

The total silver content (including silver halide and an organic silver salt which is one of optional components) in the light-sensitive layer preferably is in the range of from 0.1 mg/m$^2$ to 10 g/m$^2$. The silver content of the silver halide in the light-sensitive layer preferably is not more than 0.1 g/m$^2$, more preferably in the range of from 1 mg to 90 mg/m$^2$.

Various embodiments of the light-sensitive materials, optional components which may be contained in the light-sensitive layer, and auxiliary layers which may be optionally arranged on the light-sensitive materials are described below.

Binders employable in the light-sensitive material preferably are transparent or semi-transparent hydrophilic binders. Examples of the binders include natural substances, such as gelatin, gelatin derivatives, cellulose derivatives, starch, and gum arabic; and synthetic polymeric substances, such as water-soluble polyvinyl compounds e.g., polyvinyl alcohol, polyvinylpyrrolidone, and acrylamide polymers. In addition to the synthetic polymeric substances, vinyl compounds dispersed in the form of latex, which are particularly effective to increase dimensional stability of photographic materials, can be also used. These binders can be used singly or in combination.

Examples and usage of the other optional components which can be contained in the light-sensitive layer are described in the above-mentioned publications concerning the light-sensitive material, and in Research Disclosure Vol. 170, No. 17029, 9-15 (June 1978).

Examples of auxiliary layers which are optionally arranged on the light-sensitive material include an image-receiving layer, a heating layer, an antistatic layer, an anticurl layer and a release layer.

Instead of the use of the image-receiving material, the image-receiving layer can be arranged on the light-sensitive material to produce the desired image on the image-receiving layer of the light-sensitive material. The image-receiving layer of the light-sensitive material can be constructed in the same manner as the layer of the image-receiving material. The details of the image receiving layer will be described later.

Examples and usage of the other auxiliary layers are also described in the above-mentioned publications and applications concerning the light-sensitive material.

The light-sensitive material of the invention can be prepared, for instance, by the following process.

The light-sensitive material is usually prepared by dissolving, emulsifying or dispersing each of the components of the light-sensitive layer in an adequate medium to obtain coating solution wherein at least silver halide and a polymerizable compound are contained and then coating the obtained coating solution on a support.

The coating solution can be prepared by mixing liquid compositions each containing a component of the light-sensitive layer. Liquid composition containing two or more components may be also used in the preparation of the coating solution. Some components of the light-sensitive layer can be directly added to the coating solution or the liquid composition. Further, a secondary composition can be prepared by emulsifying the oily (or aqueous) composition in an aqueous (or oily) medium to obtain the coating solution.

A light-sensitive material of the invention can be prepared by coating and drying the above-prepared coating solution on a support in the conventional manner.

Use of the light-sensitive material is described below.

In the use of the light-sensitive material of the invention, a development process is conducted simultaneously with or after an imagewise exposure.

Various exposure means can be employed in the imagewise exposure, and in general, the latent image on the silver halide is obtained by imagewise exposure to radiation including visible light. The type of light source and exposure can be selected depending on the light-sensitive wavelengths determined by spectral sensitization or sensitivity of silver halide. Original image can be either monochromatic image or color image.

Development of the light-sensitive material can be conducted simultaneously with or after the imagewise exposure. The development can be conducted using a developing solution in the same manner as the image forming method described in Japanese Patent Publication No. 45(1970)-11149. The image forming method which employs a heat development process has an advantage of simple procedures and short processing time because of the dry process. Thus, the latter method is preferred as the development process of the light-sensitive material.

Heating in the heat development process can be conducted in various known manners. The heating layer which is arranged on the light-sensitive material can be used as the heating means. Heating temperatures for the development process usually ranges from 80° C. to 200° C., and preferably from 100° C. to 160° C. Various heating patterns are applicable. The heating time is usually from 1 sec. to 5 min., and preferably from 5 sec. to 1 min.

During the above development process, a polymerizable compound in a portion where a latent image of the silver halide has been formed or in a portion where a latent image of the silver halide has not been formed is polymerized. In a general system, the polymerizable compound in a portion where the latent image has been formed is polymerized. If a nature or amount of the reducing agent is controlled, the polymerizable compound in a portion where the latent image has not been formed can be polymerized in the same manner as the light-sensitive material described in Japanese Patent Provisional Publication No. 61(1986)-260241.

In the above development process, a polymer image can be formed on the light-sensitive layer. A pigment image can be also obtained by fixing pigments to the polymer image.

The image can be also formed on the image-receiving material. The image-receiving material is described hereinbelow. The image forming method employing the image-receiving material or the image-receiving layer is described in Japanese Patent Provisional Publication No. 61(1986)-278849.

Examples of the material employable as the support of the image-receiving material include baryta paper in addition to various examples which can be employed as the support of the known light-sensitive material.

The image-receiving material is usually prepared by providing the image-receiving layer on the support. The image-receiving layer can be constructed according to the color formation system. In the cases that a polymer image is formed on the image-receiving material and that a dye or pigment is employed as the color image forming substance, the image-receiving material be composed of a simple support.

For example, when a color formation system using a color former and developer is employed, the developer can be contained in the image-receiving layer. Further, the image-receiving layer can be composed of at least one layer containing a mordant. The mordant can be selected from the compounds known in the art of the conventional photography according to the kind of the color image forming substance. If desired, the image-receiving layer can be composed of two or more layers containing two or more mordants different in the mordanting power from each other.

The image-receiving layer preferably contains a polymer as binder. The binder which may be employed in the above-mentioned light-sensitive layer is also employable in the image-receiving layer.

The image-receiving layer can be composed of two or more layers according to the above-mentioned functions. The thickness of the image-receiving layer preferably ranges from 1 to 100 μm, more preferably from 1 to 20 μm.

After the development process, pressing the light-sensitive material in contact with the image-receiving material to transfer the polymerizable compounds which is still polymerizable to the image-receiving material, a polymer image can be obtained in the image-receiving material. The process for pressing can be carried out in various known manners.

In the case that the light-sensitive layer contains a color image forming substance, the color image forming substance is fixed by polymerization of the polymerizable compound. Then, pressing the light-sensitive material in contact with the image-receiving material to transfer the color image forming substance in unfixed portion, a color image can be produced on the image-receiving material.

The light-sensitive material can be used for monochromatic or color photography, printing, radiography, diagnosis (e.g., CRT photography of diagnostic device using supersonic wave), copy (e.g., computer-graphic hard copy), etc.

The present invention is further described by the following examples without limiting the invention.

EXAMPLE 1

Preparation of Silver Halide Emulsion

In 3,000 ml of water were dissolved 40 g of gelatin and 23.8 g of potassium bromide, and the resulting gelatin solution was kept at 50° C. To the gelatin solution, 200 ml of an aqueous solution containing 34 g of silver nitrate was added under stirring for 10 minutes. Subsequently, the mixture 100 ml of an aqueous solution containing 3.3 g of potassium iodide was added for 2 min. Excess salts were sedimented and removed from the resulting emulsion by pH-adjustment. Thereafter, the emulsion was adjusted to pH 6.0 to obtain a silver bromoiodide emulsion. The yield of the emulsion was 400 g.

Preparation of Silver Benzotriazole Emulsion

In 3,000 ml of water were dissolved 28 g of gelatin and 13.2 g of benzotriazole, and the solution was kept at 40° C. while stirring. To the solution was added 100 ml of an aqueous solution containing 17 g of silver nitrate for 2 minutes. Excess salts were sedimented and removed from the resulting emulsion by pH-adjustment. Thereafter, the emulsion was adjusted to pH 6.30 to obtain a silver benzotriazole emulsion. The yield of the emulsion was 400 g.

Preparation of Light-Sensitive Composition

In 100 g of trimethylolpropane triacrylate were dissolved 0.40 g of the following copolymer, and 6.00 g of Pargascript Red I-6-B (tradename, Chiba-Geigy). In 10.8 g of the resulting solution was dissolved a solution of 0.22 g of Emulex NP-8 (Nippon Emulsion Co., Ltd.), 0.65 g of the following hydrazine derivative and 0.73 g of the following developing agent in 2.4 g of methylene chloride. Further, to the resulting solution was added a mixture of 2.4 g of the silver halide emulsion and 2 g of the silver benzotriazole emulsion, 0.066 g of benzotriazole. The mixture was stirred at 15,000 r.p.m. for 5 min. to obtain a light-sensitive composition (average diameter of oily droplets: 0.8 μm).

(Developing agent)

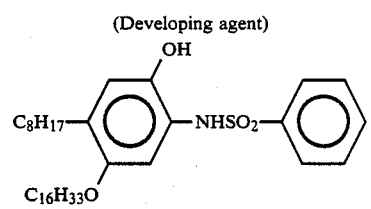

(Copolymer)

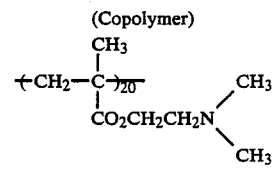

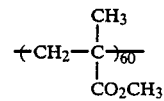

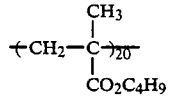

(Hydrazine derivative)

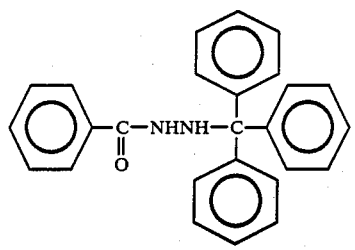

Preparation of Light-Sensitive Microcapsule

In the above light-sensitive composition was dissolved 10 g of an addition compound of xylylene diisocyanate and trimethylolpropane (Takenate D110N, Takeda Chemical Industries), and this mixture was added to 50 g. of 4.0% aqueous solution of methylcellulose (Shinetsu Chemical Co., Ltd.). The resulting mixture was stirred by a homoginizer at 5,000 r.p.m. for 1 min. to yield an emulsion. The emulsion was heated to 60° C. for 2 hours under stirring at 1,000 r.p.m. to form microcapsules having a polyurea resin (average particle size: 10 μm).

EXAMPLE 2

In the light-sensitive composition of Example 1 was dissolved 10 g of an addition compound of xylylene diisocyanate and trimethylolpropane (Takenate D110N), and this mixture was added to 50 g. of 4.0% aqueous solution of methylcellulose (Shinetsu Chemical Co., Ltd.). The resulting mixture was stirred by a homoginizer at 5,000 r.p.m. for 1 min. to yield an emulsion. To the aqueous emulsion was added 20 g of 5% aqueous diethylenetriamine solution. The emulsion was heated to 60° C. for 2 hours under stirring at 1,000 r.p.m. to form microcapsules having a polyurea resin (average particle size: 10 μm).

EXAMPLE 3

The procedure of Example 2 were repeated except that diethylenetriamine was replaced with 5 g of ethylene glycol to form microcapsules having a polyurethane resin (average particle size: 10 μm).

Evaluation of Light-Sensitive Material

Preparation of light-sensitive material

To 10 g of the microcapsule dispersion was added 3.6 g of aqueous guanidine trichloroacetate solution (5 wt. %), and the dispersion was uniformly coated on a polyethylene terephthalate film (thickness: 100 μm) using a coating rod of #40 to give a layer having wet thickness of 70 μm and dried at approx. 40° C. to obtain a light-sensitive material according to the present invention.

Preparation of image-receiving material

To 125 g of water was added 11 g of 40% aqueous solution of sodium hexametaphosphate, and were further 34 g of zinc 3,5-di-α-methylbenzylsalicylate and 82 g of 55% slurry of calcium carbonate, followed by coarsely dispersing in a mixer. The coarse dispersion was then finely dispersed in a dynamic dispersing device. To 200 g of the resulting dispersion were added 6 g of 50% latex of SBR and 55 g of 8% aqueous solution of polyvinyl alcohol. The mixture was then uniformly coated on an art paper having basis weight of 43 g/m² to give a layer having wet thickness of 30 μm and dried to obtain an image-receiving material.

Evaluation of light-sensitive material

Each of the light-sensitive materials was imagewise exposed to light using a tungsten lamp at 2,000 lux for 1 second and then heated on a hot plate at 125° C. for 40 seconds. Each of the exposed and heated light-sensitive materials was then combined with the image-receiving material and passed through press rolls under pressure of 350 kg/cm².

Each of the light-sensitive materials prepared in Examples 1, 2 and 3 formed a positive image having reflection density of approx. 1.0. The density on the image-receiving paper corresponding to the exposed portion of the each light-sensitive material showed not higher than 0.1.

We claim:

1. A light-sensitive microcapsule containing silver halide grains and an ethylenic unsaturated polymerizable compound wherein said ethylenic unsaturated polymerizable compound is enclosed with a shell comprising at least a resin selected from the group consisting of polyurea resin and a polyurethane resin, and wherein a portion of said silver halide grains are embedded in the shell.

2. The light-sensitive microcapsule as claimed in claim 1, wherein a reducing agent is further contained in the microcapsule.

3. The light-sensitive microcapsule as claimed in claim 1, wherein a color image forming substance is further contained in the microcapsule.

4. The light-sensitive microcapsule as claimed in claim 1, wherein the shell comprises a polyurea resin prepared by a reaction between a polyisocyanate compound contained together with the silver halide and the ethylenic unsaturated polymerizable compound in a hydrophobic droplet and a polyamine compound contained in an aqueous medium in which the hydrophobic droplet is dispersed.

5. The light-sensitive microcapsule as claimed in claim 1, wherein the shell comprises a polyurethane resin prepared by a reaction between a polyisocyanate compound contained together with the silver halide and the ethylenic unsaturated polymerizable compound in a hydrophobic droplet and a polyol compound contained in an aqueous medium in which the hydrophobic droplet is dispersed.

6. The light-sensitive microcapsule as claimed in claim 1, wherein the microcapsule has an average diameter in the range of 0.5 to 50 μm.

7. A light-sensitive material comprising a light-sensitive layer provided on a support wherein the light-sensitive layer contains microcapsules containing silver halide grains and an ethylenic unsaturated polymerizable compound enclosed with a shell comprising at least a resin selected from the group consisting of polyurea resin and polyurethane resin, and a reducing agent, a portion of said silver halide grains being embedded in the shell of the microcapsule.

8. The light-sensitive material as claimed in claim 7, wherein a reducing agent is further contained in the microcapsule.

9. The light-sensitive material as claimed in claim 7, wherein a color image forming substance is further contained in the microcapsule.

10. The light-sensitive material as claimed in claim 7, wherein the shell of the microcapsule comprises a polyurea resin prepared by a reaction between a polyisocyanate compound contained together with the silver halide and the ethylenic unsaturated polymerizable compound in a hydrophobic droplet and a polyamine compound contained in an aqueous medium in which the hydrophobic droplet is dispersed.

11. The light-sensitive material as claimed in claim 7, wherein the shell of the microcapsule comprises a polyurethane resin prepared by a reaction between a polyisocyanate compound contained together with the silver halide and the ethylenic unsaturated polymerizable compound in a hydrophobic droplet and a polyol compound contained in an aqueous medium in which the hydrophobic droplet is dispersed.

12. The light-sensitive material as claimed in claim 7, wherein the microcapsule has an average diameter in the range of 0.5 to 50 μm.

13. The light-sensitive microcapsule claimed in claim 1, wherein the amount of the ethylenic unsaturated polymerizable compound ranges from 5 to $1.2 \times 10^5$ times by weight as much as the amount of the silver halide grains.

14. The light-sensitive material claimed in claim 7, wherein the amount of the ethylenic unsaturated polymerizable compound ranges from 5 to $1.2 \times 10^5$ times by weight as much as the amount of the silver halide grains.

* * * * *